United States Patent
Thakur et al.

(10) Patent No.: US 9,234,936 B1
(45) Date of Patent: Jan. 12, 2016

(54) CRYSTAL OSCILLATOR MONITORING CIRCUIT

(71) Applicants: Nishant Singh Thakur, Indore (IN); Rakesh Pandey, Ghaziabad (IN); Manmohan Rana, Ghaziabad (IN)

(72) Inventors: Nishant Singh Thakur, Indore (IN); Rakesh Pandey, Ghaziabad (IN); Manmohan Rana, Ghaziabad (IN)

(73) Assignee: FREESCALE SEMICONDUCTOR,INC, Austin, TX (US)

( * ) Notice: Subject to any disclaimer, the term of this patent is extended or adjusted under 35 U.S.C. 154(b) by 0 days.

(21) Appl. No.: 14/451,404

(22) Filed: Aug. 4, 2014

(51) Int. Cl.
*G01R 31/28* (2006.01)
*H03B 5/32* (2006.01)

(52) U.S. Cl.
CPC ............... *G01R 31/282* (2013.01); *H03B 5/32* (2013.01)

(58) Field of Classification Search
CPC ........ H03B 1/00; G01R 31/28; G01R 31/282; G01R 31/2822; G01R 31/2824
USPC .......... 331/116 R, 154, 158, 182, 183, 34, 44
See application file for complete search history.

(56) References Cited

U.S. PATENT DOCUMENTS

| | | | |
|---|---|---|---|
| 4,583,013 A | 4/1986 | Gupta | |
| 4,982,116 A | 1/1991 | Lee | |
| 5,151,666 A * | 9/1992 | Tamagawa | 331/64 |
| 5,369,377 A | 11/1994 | Benhamida | |
| 5,828,243 A | 10/1998 | Bagley | |
| 5,844,435 A | 12/1998 | Grundvig | |
| 5,936,452 A | 8/1999 | Utsuno | |
| 6,343,334 B1 | 1/2002 | Uemura | |
| 6,529,447 B1 | 3/2003 | Anil et al. | |
| 6,597,204 B2 | 7/2003 | Imamura | |
| 6,819,196 B2 | 11/2004 | Lovelace et al. | |
| 6,888,391 B2 | 5/2005 | Saita | |
| 6,900,701 B2 | 5/2005 | Chan | |
| 7,123,113 B1 * | 10/2006 | Brennan et al. | 331/158 |
| 7,155,628 B2 | 12/2006 | Keithley | |
| 7,714,673 B2 | 5/2010 | Wu et al. | |
| 7,764,126 B2 | 7/2010 | Shioda | |
| 7,924,061 B2 | 4/2011 | Guillot et al. | |
| 7,924,108 B2 | 4/2011 | Dao et al. | |
| 8,717,066 B2 | 5/2014 | Ohnishi et al. | |
| 8,816,786 B2 * | 8/2014 | Tham | 331/109 |
| 2004/0160285 A1 * | 8/2004 | Lovelace et al. | 331/183 |
| 2007/0096841 A1 * | 5/2007 | Connell et al. | 331/183 |
| 2010/0283510 A1 | 11/2010 | Zhao | |
| 2011/0286561 A1 * | 11/2011 | O'Sullivan | 375/358 |
| 2012/0098609 A1 * | 4/2012 | Verma et al. | 331/158 |
| 2012/0218012 A1 | 8/2012 | Nix | |
| 2012/0242419 A1 | 9/2012 | Tsai et al. | |
| 2014/0266487 A1 * | 9/2014 | Vaishnav | 331/183 |

* cited by examiner

*Primary Examiner* — Jeffrey Shin
(74) *Attorney, Agent, or Firm* — Charles E. Bergere

(57) ABSTRACT

In an integrated circuit, a clock monitor circuit detects when an analog clock signal output by an on-chip crystal oscillator has stabilized. The clock monitor circuit uses an envelope follower circuit to monitor the envelope of the analog clock signal and compare the amplitude of the envelope with a predetermined amplitude value. When the predetermined value is reached and the envelope has remained steady for a predetermined time, an oscillator okay signal is generated. If an oscillator okay signal is not detected within another predetermined time, then an oscillator failure signal may be generated.

10 Claims, 2 Drawing Sheets

CRYSTAL OSCILLATOR MONITORING CIRCUIT

BACKGROUND OF THE INVENTION

The present invention relates generally to crystal oscillators and more particularly to a circuit for detecting stable operation of a crystal oscillator.

Crystal oscillators are a vital part of many integrated circuit devices such as a system-on-chip (SOC). Crystal oscillators are used to provide an accurate and stable clock reference for the SOC and its associated phase-locked loops (PLL). Typically, crystal oscillators take some time to stabilize, with oscillations growing as an envelope over a certain time period until the amplitude of the oscillations reaches a stabilized level. The time that these oscillations take to stabilize depends on factors like load capacitance, aging, and ambient operating conditions.

Known crystal oscillator monitoring circuits observe the digital clock output from the crystal oscillator and measure its duty cycle but provide no information about the sinusoidal oscillations (i.e., the analog clock output) also produced by the crystal oscillator. Some SOC devices use a counter-based fixed delay (typically between 1 ms and 5 ms) after start-up before running the SOC. However, as a crystal oscillator's boot time is greatly dependent on parasitic components, a boot time of anything up to 100 ms is possible.

Therefore it would be beneficial to provide an indication that a crystal oscillator has reached a stable region of operation.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
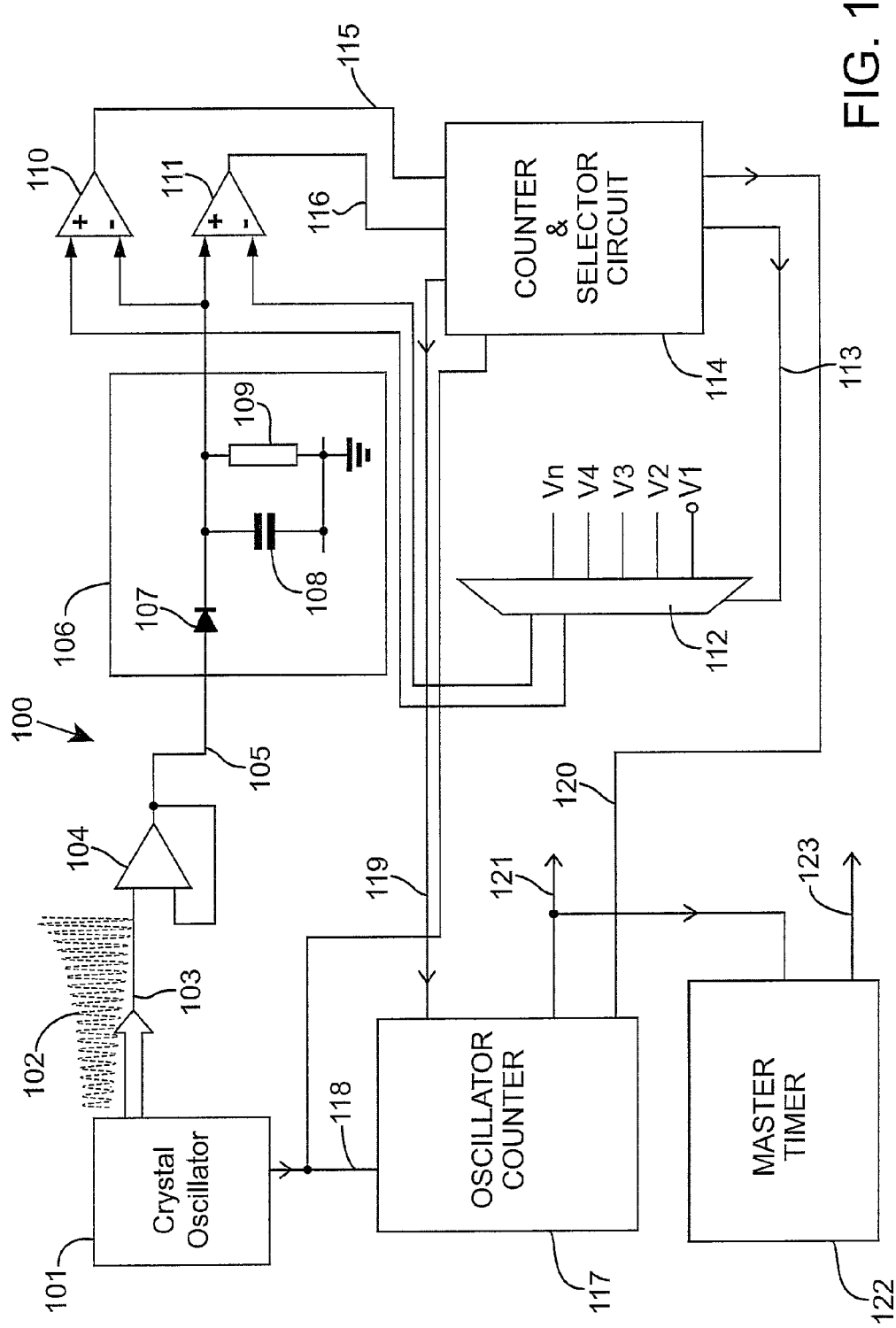
FIG. 1 is a simplified, schematic block diagram of a circuit for detecting stable operation of a crystal oscillator in accordance with a first embodiment of the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a crystal oscillator monitoring circuit. The circuit includes an envelope follower circuit for receiving an analog output signal from a crystal oscillator and for providing an envelope output signal, and signal processing circuitry connected to the envelope follower for receiving the envelope output signal, comparing the envelope output signal with a reference signal over time, and generating an output signal indicating stable operation of the crystal oscillator when the received envelope output signal reaches and maintains a desired value for a preset period of time.

In another embodiment, the present invention provides a method for detecting stable operation of a crystal oscillator. The method includes the steps of: receiving, in an envelope follower circuit, an oscillating analog output signal from the crystal oscillator; providing an envelope output signal comprising the envelope of the oscillating analog output signal; comparing the envelope output signal with a reference signal over time; and generating an output signal indicative of stable operation of the crystal oscillator when the envelope output signal reaches and maintains a desired value for a preset period of time.

In one example, a comparator makes successive comparisons over time between the envelope output signal and first and second reference voltages. The first and second reference voltages are increased in discrete steps each time the envelope output signal exceeds the first reference voltage and decreased each time the envelope output signal falls below the second reference voltage. A counter times the preset period of time and is reset every time the envelope output signal either exceeds the first reference voltage or falls below the second reference voltage. When the preset period of time expires without the counter having been reset, an "oscillator OK" signal is generated, indicating that the oscillator has attained a stable operating level. A minimum value of at least one of the first and second reference voltages may be selected below which even if the counter expires, an "oscillator ok" will not be generated as this signifies that the oscillator has not reached a desired operating level, even though its output has stabilized.

In another embodiment, an analog to digital converter (ADC) produces digitized values of the envelope output signal and compares successive digitized values with previous digitized values. A counter times the preset period of time and is reset every time there is a mismatch between compared digitized values. When the preset period of time expires without the counter having been reset, an "oscillator OK" signal is generated, indicating that the oscillator has attained a stable, operating level. For example, a digitized value of the envelope signal is compared with a previous digitized value plus an offset, Delta, and with a previous digitized value minus Delta. If the compared digitized value remains between these two values no reset for the counter is generated. A minimum acceptable value of output digitized value may be chosen below such that even if the counter expires, an "oscillator ok" signal will not be generated as this signifies that the oscillator has not reached a desired operating level, even though its output has stabilized.

Referring now to FIG. 1, a schematic block diagram of a first example embodiment of a crystal oscillator monitoring circuit 100 for detecting stable operation of a crystal oscillator is shown. The circuit 100 may be included in an integrated circuit device such as an SOC. A crystal oscillator 101 produces an analog, oscillating output signal 102 on line 103. The amplitude (and envelope) of the oscillating output signal 102 typically grows over time after switch-on of the crystal oscillator 102 until it reaches a stable, steady level. A buffer amplifier 104 receives the analog, oscillating output signal from the crystal oscillator 101 and produces an amplified version of the signal on its output line 105. In some embodiments, the buffer amplifier 104 is omitted. The output of the buffer amplifier 105 is connected to an input of an envelope follower circuit 106. The envelope follower circuit 106 may comprise a conventional circuit such as an envelope detector, diode detector or AM demodulator. In this example, the envelope follower circuit 106 comprises a diode 107 whose anode is connected to the output line 105 of the buffer amplifier 104, a capacitor 108 and a resistor 109. The capacitor 108 and resistor 109 are connected in parallel with each other between the cathode of the diode 107, which serves as the output of the envelope follower circuit 106, and ground. The output of the envelope follower circuit 106 is connected to the inverting input of a first comparator 110 and to the non-inverting input of a second comparator 111. The non-inverting input of the first comparator 110 receives a lower reference voltage and the inverting input of the second comparator 111 receives an upper reference voltage, both reference voltages being supplied by a selectable voltage source 112. The selectable voltage source 112 can select from several voltage values from V1, increasing in value through V2 up to Vn in discrete steps. One of these voltage values may be the amplitude of the voltage appearing at the output of the envelope follower 106, which corresponds to a desired, stable operating amplitude value of the crystal oscillator analog output signal 102. The upper and lower reference voltages are selected depending on an input to the selectable voltage source 112 on line 113, which is generated by a counter and selector circuit 114. The counter and selector circuit 114 includes a conventional up-down counter and decoder logic for generating the signal on line 113. The counter and selector circuit 114 receives a "count down" signal 115 from the first comparator 110 and a "count up" signal 116 from the second comparator 111. An oscillator counter 117 receives a digital clock output signal on line 118 from the crystal oscillator 101 and a reset signal on line 119 from the counter and selector circuit 114. The digital clock output signal from the crystal oscillator 101 on line 118 is also fed to the counter and selector circuit 114 for synchronisation purposes. The oscillator counter 117 counts oscillator clock pulses (or edges) of the digital clock output signal, which it receives on line 118. The oscillator counter 117 also receives a count value on line 120 from the counter and selector circuit 114. An output 121 of the oscillator counter 117 is connected to a master timer 122. The master timer 122 is clocked by an "on-chip" source (not shown) that is separate from the crystal oscillator 101; an RC or IRC oscillator for example. The master timer 122 generates an output signal on line 123. The outputs of the oscillator counter 117 and the master timer 122 on lines 121 and 123 respectively, may be fed to other inputs of an SOC in which the circuit 100 is included.

In operation, initially, all components of the circuit 100 are reset. A reference count Value "REF COUNT" is set for the oscillator counter 117. A minimum count value "MIN AMP COUNT" is set for the counter and selector circuit 114. A reference timer value "REF TIMER" is set for the master timer 122. Initially, the counter and selector circuit 114 sets its output 113 so that the selectable voltage source 112 selects a voltage V1 for application to the second comparator 110 as an upper reference voltage. The selectable voltage source 112 also outputs a lower reference voltage that is received by the first comparator 110. This lower reference voltage has a value that is lower than the upper reference voltage by a known and fixed amount. Say for example that initially, the selected upper reference voltage V1 is 400 mV and the difference between upper and lower reference voltages is chosen to be 300 mV. Therefore the lower reference voltage is 100 mV.

On start-up, if the output of the crystal oscillator and therefore of the envelope detector 106 is 0v, then the 'count down' signal from the first comparator 110 is at a logical "1" and the 'count up' signal 116 from the second comparator 111 is at a logical "0". Once the crystal oscillator's amplitude grows such that the output of the envelope follower 106 reaches 100 mV, the first comparator 110 will trip causing the "count down" signal 115 to move to a logical "0". The "count up" signal 116 remains at a logical "0". As the amplitude of the crystal oscillator's output 102 grows still further, the output of the envelope detector 106 will reach 400 mV (V1). At this point, the second comparator 111 trips and causes the "count up" signal 116 to move to a logical "1" (with the "count down" signal remaining at a logical "0"). The counter and selector circuit 114 is thus incremented and its count value moves from zero to one, this count value being registered by the oscillator counter 117. This increment of the count value also triggers generation of a reset signal by the counter and oscillator counter 114, which is sent to the oscillator counter 117. On receipt of this reset signal, the oscillator counter 117 resets its count to zero and commences counting oscillator output pulses again. The incremented count value of 'one' also causes the counter and selector circuit 114 to select the next reference voltage V2, say 600 mV as a new upper reference voltage for application to the second comparator 111. The lower reference voltage also changes now to a value of 300 mV and is applied to the first comparator 110.

Following these changes in the upper and lower reference voltages, the "count up" signal 116 moves to a logical "0" while the "countdown" signal 115 remains at a logical "0". As the output from the crystal oscillator 101 continues to increase, when the output of the envelope follower 106 reaches 600 mV (V2), the "count up" signal 116 will move to a logical "1" thereby incrementing the count value in the counter and selector circuit 114 to a value of "two". This new count value triggers generation of another reset signal that is sent to the oscillator circuit 117, the new count value (of two) is registered by the oscillator counter 117 and also at this point, a new upper voltage reference, V3, is selected. In this example, V3 is 800 mV and so the lower voltage reference now becomes 500 mV. On receiving these new voltage reference values at the comparators 110, 111, the "count up" signal 116 moves to a logical "0" while the "count down" signal 115 remains at a logical "0." This process can continue as the output from the crystal oscillator 101 increases in amplitude and every time the count value at the counter and selector circuit 114 changes, the oscillator counter 117 is reset.

In some circumstances, the count value of the counter and selector circuit 114 may be decremented. Assume that the output amplitude of the envelope detector 106 has reached 400 mv, the upper reference voltage is changed to 600 mV and the lower reference voltage to 300*mv* but then, instead of increasing in amplitude, the output from the envelope detector 106 drops to 250 mv. Then the "count down" signal 115 will move to a logical "1" while the "count up" signal 116 will remain at a logical "0". This will result in the count value of the counter and selector circuit 114 being decremented by one and in turn, will result in the counter and selector circuit 114 re-selecting a lower value (V1) as the upper voltage reference. It will also send a reset signal to the oscillator counter 117 that also will register the new (decremented) count value. If the crystal oscillator 101 recovers and its output 102 begins to increase, then the count value of the counter and selector circuit 114 will go up again the next time the second comparator 111 triggers.

Say that the desired stable amplitude of the output 102 of the crystal oscillator 101 corresponds to an envelope follower output of 1200 mV, and assume also that 1200 mV is the value of the voltage setting Vn in the selectable voltage source 112, which in turn corresponds to a count value (in the counter and selector circuit 114) of 'four' i.e., the preset value "MIN AMP COUNT." (Counter values zero, one, two and three correspond with voltage settings V1, V2, V3 and V4 respectively). When the count value in the counter and selector circuit 114 reaches "MIN AMP COUNT" and the count value of the oscillator counter 117 has reached "REF COUNT" (i.e., no reset signal has been received from the counter and selector circuit 114 for a time period equivalent to "REF COUNT" since the oscillator counter 117 registered a counter and selector circuit equal to "MIN AMP COUNT"), then this indicates that the crystal oscillator output 102 has settled to a desired, stable value for an acceptable, predetermined time period (equivalent to the value of REF COUNT). Once these conditions are reached, the oscillator counter 117 generates an "oscillator OK" signal on line 121. This can be used by the SOC of which the circuit 100 is a part, as an indication that it can proceed further in the start-up and operation process. If the count value of the oscillator counter 117 should reach "REF COUNT" at any time but the count value received from the counter and selector circuit 114 is not equal to "MIN AMP COUNT," then the oscillator counter 117 will roll-over and no "oscillator OK" signal will be generated because even though the crystal oscillator 101 may have been stable for a set time, its output level has still not reached the minimum amplitude requirement.

The output 121 of the oscillator counter 117 is fed to the master timer 122. The master timer 122 is set to run on initialization of the circuit 100 and times the period, "REF TIMER." If the period "REF TIMER" (typically 50 ms) expires before an "oscillator OK" signal is received from the oscillator counter 117, then it is assumed that the crystal oscillator 101 has failed and a warning signal is output on line 123 by the master timer 123.

Even after the "oscillator OK signal" has been generated by the oscillator counter, the circuit 100 can continue to monitor the performance of the crystal oscillator 101 and de-assert the "oscillator OK" signal if its performance degrades. For example, the comparators 110 and 111 can continue to compare the envelope follower's output with the reference voltages and the first comparator 110 can decrement the count value in the counter and selector circuit 114 if the compared amplitude falls below the lower reference voltage. The counter and selector circuit 114 can respond to this by resetting the oscillator counter, which in turn, changes the state of its output on line 121.

Figure 2:
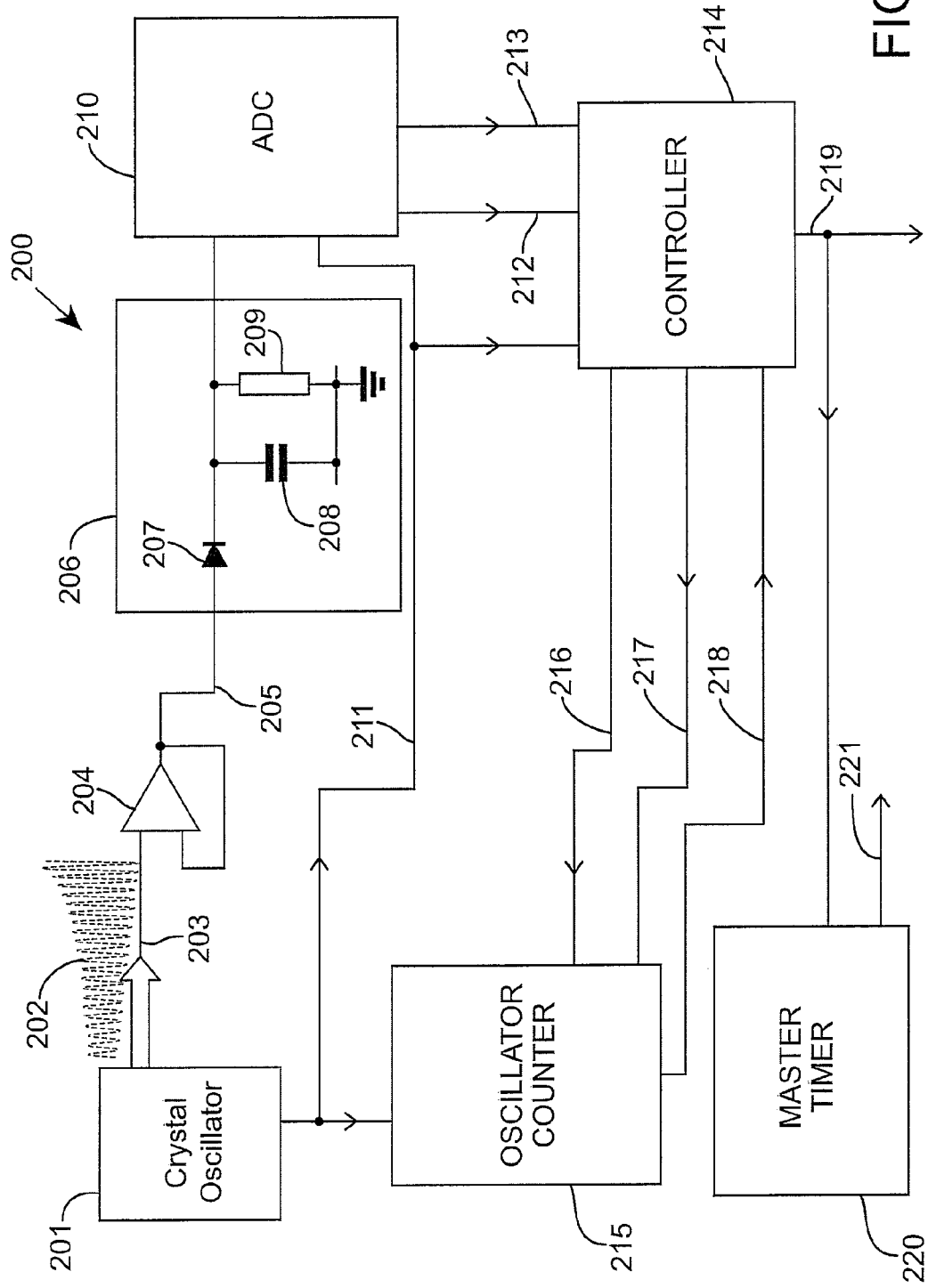
FIG. 2 is a simplified, schematic block diagram of a circuit for detecting stable operation of a crystal oscillator in accordance with a second embodiment of the invention.

Referring now to FIG. 2, a second example embodiment of a circuit 200 for detecting stable operation of a crystal oscillator is shown. The circuit 200 may be included in an integrated circuit device such as an SOC. A crystal oscillator 201 produces an analog, oscillating output signal 202 on line 203. The amplitude (and envelope) of the oscillating output signal 202 typically grows over time after switch-on of the crystal oscillator 202 up to a stable, steady level. A buffer amplifier 204 receives the analog, oscillating output signal from the crystal oscillator 201 and produces an amplified version of the signal on its output line 205. In some embodiments, the buffer amplifier 204 is omitted. The output of the buffer amplifier 205 is connected to an input of an envelope follower circuit 206. The envelope follower circuit 206 may comprise a conventional circuit such as an envelope detector, diode detector or AM demodulator. In this example, the envelope follower circuit 206 comprises a diode 207 whose anode is connected to the output line 105 of the buffer amplifier 204, a capacitor 208 and a resistor 209. The capacitor 208 and resistor 209 are connected in parallel with each other between the cathode of the diode 207 (which serves as the output of the envelope follower circuit 206) and ground. The output of the envelope follower circuit 206 is connected to an analog to digital converter (ADC) 210, which in this example is a successive approximation ADC. Successive approximation ADCs are well known and use a comparator to successively narrow a range that contains the input voltage. At each successive step, the ADC 210 compares the input voltage with the output of an internal digital to analog converter (DAC) that can represent the midpoint of a selected voltage range. At each step in this process, the approximation is stored in a successive approximation register (SAR). The ADC 210 also receives a clock input signal on line 211, which is provided by a digital clock output signal from the crystal oscillator 201. First and second outputs on lines 212 and 213, respectively, are connected to a controller 214. An oscillator counter 215 receives the digital clock output signal from the crystal oscillator 201 and a reset signal on line 216 from the controller 214. The oscillator counter 215 counts pulses (or edges) of the digital clock output signal which it receives from the crystal oscillator 201. The digital clock output signal is also received by the controller 214 for synchronisation purposes. The oscillator counter 215 also receives an enable signal on line 217 from the controller 214. An output 218 of the oscillator counter 215 is connected to the controller 214. The controller 214 generates an output on line 219 which is connected to a master timer 220. The master timer is clocked by an "on-chip" source (not shown) that is separate from the crystal oscillator 101; an RC or IRC oscillator for example. The master timer 122 generates an output signal on line 221. The outputs of the controller 214 and of the master timer 220 on lines 219 and 221 respectively, may be fed to other inputs of an SOC in which the apparatus 200 is included.

In operation, initially, all components of the apparatus 200 are reset. A reference count Value "REF COUNT" is set for the oscillator counter 215. A reference timer value "REF TIMER" is set for the master timer 220. The first output on line 212 of the ADC 200, which is a "code ready" signal is set and received by the controller 214. The ADC 210, which can be typically a three or four bit device, receives the output of the envelope follower 206 and generates a digital SAR code. The digital code bears a particular relationship to the amplitude of the output of the envelope follower 206. The digital SAR code appears on the second output line 213 of the ADC 210 and is fed to the controller 214. The code increases and decreases depending on how the amplitude of the output of the envelope follower 206 is changing. Once a pre-set minimum value for the digital SAR code is reached, the oscillator counter 215 is enabled by an output generated by the controller 214 and commences counting crystal oscillator pulses. The controller 214 compares each received digital SAR code with the previous received digital SAR code. Every time the result of the comparison shows a mismatch, a reset signal is generated and applied to the oscillator counter 215. In an example, a digitized value of the envelope signal is compared with a previous digitized value plus an offset, Delta, and with a previous digitized value minus Delta. On receipt of a reset signal, the oscillator counter 215 resets its count to zero and commences counting oscillator output pulses again. Once the digital SAR code received at the controller 214 stops changing except for the least significant bit (LSB) or the LSB-1 depending on the chosen step size of the ADC 210 or it remains between a pre-set expected values of digitized output +/−Delta, this signifies that the amplitude of the crystal oscillator's analog output has reached a stable value and no reset for the counter is generated. A minimum acceptable value of output digitized value is chosen below which even if the oscillator counter 215 expires, an "oscillator ok" signal will not be generated as this signifies that the oscillator has not reached a desired operating level, even though its output has stabilized. Note that the ADC 210 may see the LSB toggle even when the oscillator's output has stabilized but this may be ignored. For a large step size it is unlikely to toggle but for small sizes it is more likely that it will. The step size of the successive approximation register in the ADC 210 and how many LSBs to ignore (or discard) while detecting stable operation can be decided based on the particular design requirement. When the digital SAR code stops changing, the ADC goes into a wait mode. Say that the desired stable amplitude of the output 202 of the crystal oscillator 201 corresponds to an envelope follower output of 800 mV. Once the digital SAR code corresponding to this analog value stabilizes for a period long enough for the oscillator counter to count up to REF COUNT, then the oscillator counter generates a "counter expired" signal on line 218 which is received by the controller. In, response, the controller 214 generates a. "oscillator OK" signal on its output line 219. In an alternative embodiment, the "counter expired" signal generated by the oscillator counter is used as the "oscillator OK" signal.

The output 219 of the controller 214 is fed to the master timer 220. The master timer 220 is set to run on initialization of the apparatus 200 and times the period, "REF TIMER." If the period "REF TIMER" (typically 50 ms) expires before an "oscillator OK" signal is received from the controller 214, then it is assumed that the crystal oscillator 201 has failed and a warning signal is output on line 221 by the master timer 220.

Even after the "oscillator OK signal" is generated by the controller, 214, the controller can continue to monitor the digital SAR codes received from the ADC 210. If a significant change occurs, then the controller 214 de-asserts the "oscillator OK" signal by changing the state of the signal on its output line 219.

Advantageously, because the oscillation counter 215 and ADC 210 receive outputs from the crystal oscillator 201, the apparatus 200 can detect with confidence that the crystal oscillator 201 is actually running as intended and the generation of the "oscillator OK" signal is not merely a result of the detection of noise or a DC voltage.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals. Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the counter and selector circuit, oscillator counter and master timer of FIG. 1 may all be included in one device or their functionality may be distributed over a plurality of devices. Further, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the circuit shown in FIG. 1 may be implemented in an integrated circuit. Such an integrated circuit may be a package containing one or more dies. Alternatively, the examples may be implemented as any number of separate integrated circuits or separate devices interconnected with each other in a suitable manner. For example an integrated circuit device may comprise one or more dies in a single package with electronic components provided on the dies that form the circuits and which are connectable to other components outside the package through suitable connections such as pins of the package and bond wires between the pins and the dies.

Also for example, the examples, or portions thereof, may be implemented as soft or code representations of physical circuitry or of logical representations convertible into physical circuitry, such as in a hardware description language of any appropriate type.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A clock monitoring circuit for detecting stable operation of a crystal oscillator, the clock monitoring circuit comprising:
   an envelope follower circuit for receiving an analog output signal from the crystal oscillator and providing an envelope output signal; and
   signal processing circuitry, connected to the envelope follower circuit, for receiving the envelope output signal, comparing the envelope output signal with a reference signal over time using a comparator, and generating an output signal indicating stable operation of the crystal oscillator when the envelope output signal reaches and maintains a desired value for a preset period of time,
   wherein:
      the comparator comprises an analog to digital converter (ADC) for producing digitized values of the received envelope output signal over time, and
      the reference signal is a previous digitized value of the received envelope output signal.

2. The apparatus of claim 1, wherein the reference signal comprises first and second reference voltages and wherein the comparator makes successive comparisons over time between the envelope output signal and the first and second reference voltages, and wherein the signal processing circuitry increases the first and second reference voltages in discrete steps each time the envelope output signal exceeds the first reference voltage and decreases the first and second reference voltages each time the envelope output signal falls below the second reference voltage.

3. The apparatus of claim 2, wherein the signal processing circuitry includes a counter for timing the preset period of time, and wherein the counter is reset every time the received envelope output signal compared by the comparator either exceeds the first reference voltage or falls below the second reference voltage.

4. The clock monitoring circuit of claim 1, wherein the signal processing circuitry further comprises a counter for timing the preset period of time, wherein the counter is reset every time there is a mismatch between the reference signal and a compared, digitized value of the envelope output signal.

5. The clock monitoring circuit of claim 1, wherein the signal processing circuitry includes a timer for timing a preset time interval and for detecting generation of the output signal and for generating a warning signal if, after the preset time interval has expired, the output signal has not been detected.

6. In an integrated circuit including a crystal oscillator, a clock monitoring circuit for detecting stable operation of the crystal oscillator, the clock monitoring circuit comprising:
   an envelope follower circuit for receiving an analog output signal from the crystal oscillator and providing an envelope output signal; and
   signal processing circuitry connected to the envelope follower circuit for receiving the envelope output signal, comparing the envelope output signal with a reference signal over time using a comparator, and generating an output signal indicating stable operation of the crystal oscillator when the received envelope output signal reaches and maintains a desired value for a preset period of time, and
   wherein:
      the reference signal comprises first and second reference voltages;
      the comparator makes successive comparisons over time between the envelope output signal and the first and second reference voltages; and
      the signal processing circuitry increases the first and second reference voltages in discrete steps each time the envelope output signal exceeds the first reference voltage and decreases the first and second reference voltages each time the envelope output signal falls below the second reference voltage.

7. A method for detecting stable operation of a crystal oscillator, the method comprising:
   receiving, in an envelope follower circuit, an oscillating analog output signal from the crystal oscillator;
   determining an envelope of the oscillating analog output signal;
   producing digitized values of the envelope over time in an analog to digital converter;
   comparing a digitized value of the envelope with a reference signal over time, wherein the reference signal comprises a previous digitized value of the envelope; and
   generating an output signal indicative of stable operation of the crystal oscillator when the envelope reaches and maintains a desired value for a preset period of time.

8. The method of claim 7, further comprising:
   making successive comparisons over time between the envelope and first and second reference voltages; and
   increasing the first and second reference voltages in discrete steps each time the envelope exceeds the first reference voltage and decreasing the first and second reference voltages each time the envelope falls below the second reference voltage.

9. The method of claim 8, further comprising:
   timing the preset period of time in a counter; and
   resetting the counter every time the envelope either exceeds the first reference voltage or falls below the second reference voltage.

10. The method of claim 7, further comprising:
   timing the preset period of time in a counter; and
   resetting the counter every time there is a mismatch between a compared, digitized value of the envelope and a previous, digitized value of the envelope.

* * * * *